United States Patent
Jung et al.

(10) Patent No.: US 9,172,396 B1
(45) Date of Patent: Oct. 27, 2015

(54) APPARATUS AND METHOD OF COMPRESSING SPATIAL DATA AND APPARATUS AND METHOD OF RESTORING COMPRESSED SPATIAL DATA

(71) Applicants: REALTIMETECH CO., LTD., Daejeon (KR); HYUNDAI MNSOFT INC., Seoul (KR)

(72) Inventors: Sung-Hoon Jung, Daejeon (KR); Hyeok Han, Daejeon (KR); Seong-il Jin, Daejeon (KR); Jong-Bum Kim, Seoul (KR)

(73) Assignees: REALTIMETECH CO., LTD. (KR); HYUNDAI MNSOFT INC. (KR)

( * ) Notice: Subject to any disclaimer, the term of this patent is extended or adjusted under 35 U.S.C. 154(b) by 0 days.

(21) Appl. No.: 14/116,824

(22) PCT Filed: Oct. 23, 2012

(86) PCT No.: PCT/KR2012/008712
§ 371 (c)(1),
(2) Date: Nov. 11, 2013

(87) PCT Pub. No.: WO2014/003248
PCT Pub. Date: Jan. 3, 2014

(30) Foreign Application Priority Data

Oct. 11, 2012 (KR) .................. 10-2012-0113122

(51) Int. Cl.
*H03M 7/00* (2006.01)
*H03M 7/30* (2006.01)
*H04Q 3/00* (2006.01)
*G06Q 30/02* (2012.01)

(52) U.S. Cl.
CPC ............ *H03M 7/30* (2013.01); *G06Q 30/0205* (2013.01); *H04Q 3/0029* (2013.01)

(58) Field of Classification Search
CPC .... H03M 7/30; G06Q 30/0205; H04Q 3/0029
USPC ............ 341/50; 707/3; 705/7.34; 379/220.01
See application file for complete search history.

(56) References Cited

U.S. PATENT DOCUMENTS

2004/0117358 A1* 6/2004 von Kaenel et al. ................. G06F 17/30241

* cited by examiner

*Primary Examiner* — Joseph Lauture
(74) *Attorney, Agent, or Firm* — Cantor Colburn LLP

(57) ABSTRACT

Provided are an apparatus and method of compressing spatial data and an apparatus and method of restoring compressed spatial data, the method of compressing spatial data including: determining the size of actual data of the spatial data stored in a unit storage space having a predetermined size; selecting the size of a compression storage space in which the spatial data is to be compressed and to be stored, in consideration of the determined size of the actual data of the spatial data; generating flag information considering the size of the actual data of the spatial data; and storing the generated flag information in a predetermined region of the compression storage space having the selected size and storing the actual data of the spatial data in the other regions of the compression storage space.

14 Claims, 12 Drawing Sheets

FIG. 9

| PARTICULAR POINT | X-COORDINATE | Y-COORDINATE |
|---|---|---|
| A | 18000000 | 18000000 |
| B | 18000020 | 18000030 |
| C | 17992020 | 17992030 |
| D | 17992120 | 17992100 |

(a)

| PARTICULAR POINT | X-COORDINATE | Y-COORDINATE |
|---|---|---|
| A | 18000000 | 18000000 |
| B | 20 | 30 |
| C | −8000 | −8000 |
| D | 100 | 70 |

(b)

FIG. 10
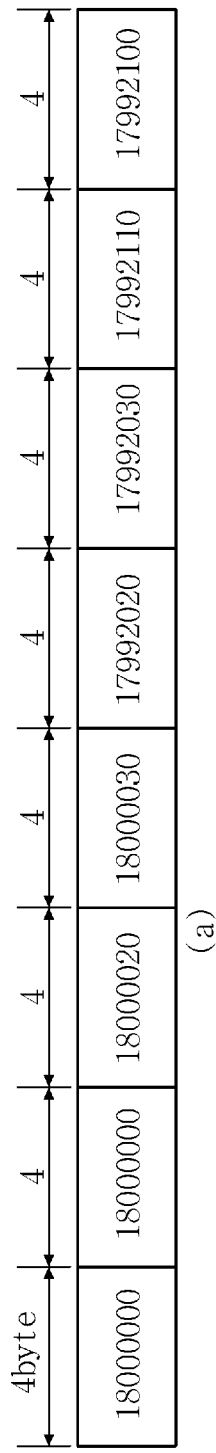
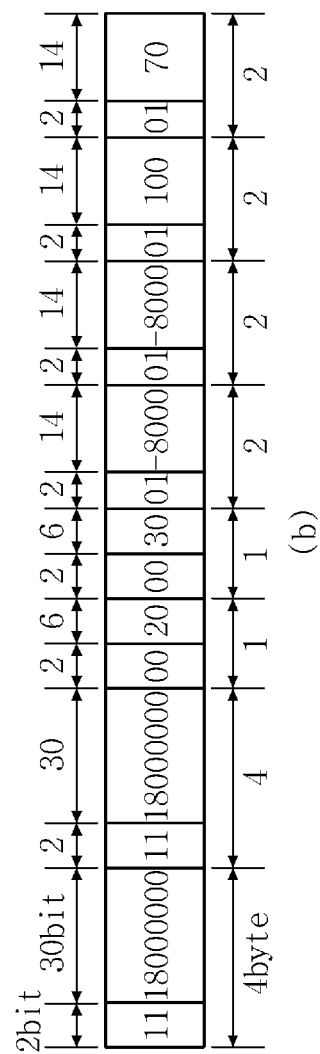

FIG. 13A

[SAMPLE 1] : 36% COMPRESSED

| ORIGINAL DATA 1 | |
|---|---|
| BINARY SIZE | SPATIAL DATA (WKT) |
| 159 bytes | LINESTRING(45701760 14952000,45700864 14953024, 45698944 14955008,45698368 14955584,45697472 14956416, 45696640 14957312,45694976 14958592,45694016 14959040, 45692480 14959296,45691392 14959040,45690688 14958016, 45690304 14956352,45690752 14955008,45691264 14953536, 45692032 14952000) |
| ABBREVIATED DATA 1 | |
| BINARY SIZE | SPATIAL DATA (WKT) |
| 102 bytes | LINESTRING(45701760 14952000,-896 1024,-1920 1984, -576 576,-896 832,-832 896,-1664 1280,-960 448, -1536 256,-1088 -256,-704 -1024,-384 -1664,448 -1344, 512 -1472,768 -1536) |

FIG. 13B

[SAMPLE 2] : 39% COMPRESSED

| | ORIGINAL DATA 1 |
|---|---|
| BINARY SIZE | SPATIAL DATA (WKT) |
| 269 bytes | LINESTRING(45216000 14604224,45215616 14606848, 45209216 14607616,45202496 14607488,45198592 14607424, 45196864 14607360,45194752 14609984,45194304 14610560, 45188416 14613248,45187456 14614976,45185024 14619456, 45180032 14622976,45178624 14623936,45178560 14624000, 45177600 14625024,45176064 14626560,45171264 14628224, 45169728 14629376,45166656 14630784,45166400 14630912, 45164544 14632128,45161408 14633344,45157504 14635840, 45154368 14637888,45151040 14640000,45148480 14641664) |
| | ABBREVIATED DATA 1 |
| BINARY SIZE | SPATIAL DATA (WKT) |
| 166 bytes | LINESTRING(45216000 14604224,-384 2624,-6400 768, -6720 -128,-3904 -64,-1728 -64,-2112 2624,-448 576, -5888 2688,-960 1728,-2432 4480,-4992 3520,-1408 960, -64 64,-960 1024,-1536 1536,-4800 1664,-1536 1152, -3072 1408,-256 128,-1856 1216,-3136 1216,-3904 2496, -3136 2048,-3328 2112,-2560 1664) |

FIG. 13C

[SAMPLE 3] : 34% COMPRESSED

| | ORIGINAL DATA 1 |
|---|---|
| BINARY SIZE | SPATIAL DATA (WKT) |
| 269 bytes | LINESTRING(45981632 14568000,45982272 14564992, 45982720 14562944,45980928 14558912,45979136 14555008, 45979328 14550016,45979328 14549504,45985664 14548864, 45988096 14550016,45990016 14550912,45990400 14551104, 45993216 14552128,46002368 14555520,46010112 14557056, 46012480 14558720,46021376 14564992,46025600 14568000) |
| | ABBREVIATED DATA 1 |
| BINARY SIZE | SPATIAL DATA (WKT) |
| 166 bytes | LINESTRING(45981632 14568000,640 -3008,448 -2048, -1792 -4032,-1792 -3904,192 -4992,0 -512,6336 -640, 2432 1152,1920 896,384 192,2816 1024,9152 3392, 7744 1536,2368 1664,8896 6272,4224 3008) |

APPARATUS AND METHOD OF COMPRESSING SPATIAL DATA AND APPARATUS AND METHOD OF RESTORING COMPRESSED SPATIAL DATA

TECHNICAL FIELD

The present invention relates to an apparatus and method of compressing spatial data and an apparatus and method of restoring compressed spatial data, and more particularly, to an apparatus and method of compressing spatial data, whereby the size of spatial data used as position information by applying several algorithms, and an apparatus and method of restoring compressed spatial data.

BACKGROUND ART

Spatial data is data that represents coordinates of a particular position of a map. The spatial data is generally established as a database and is used for various services.

However, the spatial data includes complicated coordinates indicated on the map and thus has a very large capacity compared to general relation type data.

A system that analyzes and processed spatial data and uses the spatial data in a topography-related field, such as traffic or communication is referred to as a geographic information system (GIS). Various services provided by the GIS are referred to as GIS services. Due to the above-described characteristics of the spatial data, there are many limitations in providing the GIS services in an environment in which resources are limited.

For example, when the GIS operates in the environment in which resources are limited, the whole spatial data cannot be used an should be partially used.

In this way, as a problem occurs in processing large-capacity spatial data, contents of the GIS services should be simplified. This causes lowering of the quality of the GIS services to be provided to customers.

In particular, since the consumption rate of resources is too large to process the large-capacity spatial data in a mobile terminal in which a computing resource environment is inadequate, various GIS services cannot be properly handled, and there are many limitations in configuring the GIS services.

DETAILED DESCRIPTION OF THE INVENTION

Technical Problem

The present invention provides an apparatus and method of compressing spatial data, whereby the spatial data is compressed by reducing the size of the spatial data, and an apparatus and method of restoring compressed spatial data, whereby the compressed spatial data is restored to its original size, i.e., decompressed, so that the compressed spatial data can be used.

Technical Solution

According to an aspect of the present invention, there is provided a method of compressing spatial data including: (a) determining the size of actual data of the spatial data stored in a unit storage space having a predetermined size; (b) selecting the size of a compression storage space in which the spatial data is to be compressed and to be stored, in consideration of the determined size of the actual data of the spatial data; (c) generating flag information considering the size of the actual data of the spatial data; and (d) storing the generated flag information in a predetermined region of the compression storage space having the selected size and storing the actual data of the spatial data in the other regions of the compression storage space.

According to another aspect of the present invention, there is provided a method of restoring compressed spatial data including: (a) determining a position of a compression storage space in which flag information is stored; (b) determining the size of a data storage region of the compression storage space allocated to the spatial data by reading the flag information in the position determined in (a); and (c) restoring the spatial data by reading data having the size of the data storage region determined in (b) and by storing the read data in a unit storage space having a predetermined size.

According to another aspect of the present invention, there is provided a apparatus for compressing spatial data including: a determination unit determining the size of actual data of the spatial data stored in a unit storage space having a predetermined size; a flag generation unit generating flag information considering the size of the actual data of the spatial data determined by the determination unit; a size selection unit selecting the size of a compression storage space in which the spatial data is to be compressed and to be stored, in consideration of the determined size of the actual data of the spatial data; and a compression storing unit storing the generated flag information in a predetermined region of the compression storage space having the selected size and storing the actual data of the spatial data in the other regions of the compression storage space.

According to another aspect of the present invention, there is provided an apparatus for restoring compressed spatial data including: a flag determination unit determining a position of a compression storage space in which flag information is stored; a size determination unit determining the size of a data storage region of the compression storage space allocated to the spatial data by reading the flag information in the position determined by the flag determination unit; and a data restoring unit restoring the spatial data by reading data having the size of the data storage region determined by the size determination unit and by storing the read data in a unit storage space having a predetermined size.

DESCRIPTION OF THE DRAWINGS

FIG. 9 illustrates a procedure in which coordinates of a particular point are converted through relative coordinate conversion;

FIG. 10 illustrates a state in which data is compressed through a compression procedure using flag;

FIGS. 13A through 13C show the result of compressing coordinate data of each of the plurality of elements of FIG. 12.

MODE OF THE INVENTION

The present invention will now be described more fully with reference to the accompanying drawings, in which exemplary embodiments of the invention are shown.

Figure 1:
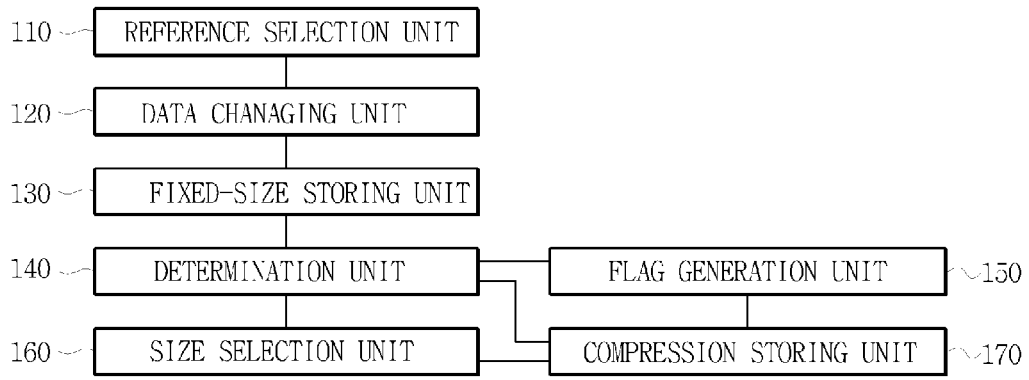
FIG. 1 is a functional block diagram of an apparatus for compressing spatial data according to an embodiment of the present invention.

An apparatus for compressing spatial data according to an embodiment of the present invention includes a reference selection unit 110, a data changing unit 120, a fixed-size storing unit 130, a determination unit 140, a flag generation unit 150, a size selection unit 160, and a compression storing unit 170, as illustrated in FIG. 1.

The reference selection unit 110 performs a function of selecting one spatial data from a plurality of spatial data aligned as reference data.

Here, the spatial data means data required to provide geographic information system (GIS) services and in particular, may be coordinate data that designates a position of a particular point in a space.

Hereinafter, an example in which each spatial data is coordinate data of each particular point, will be described.

A plurality of coordinate data may be aligned in a predetermined order, for example, in an input order or according to a degree of being adjacent. That is, alignment of the plurality of coordinate data means does not necessarily mean that the plurality of coordinate data are configured in an ascending or descending order according to a reference but may mean that the plurality of coordinate data are configured in a series of data-input order.

Figure 2:
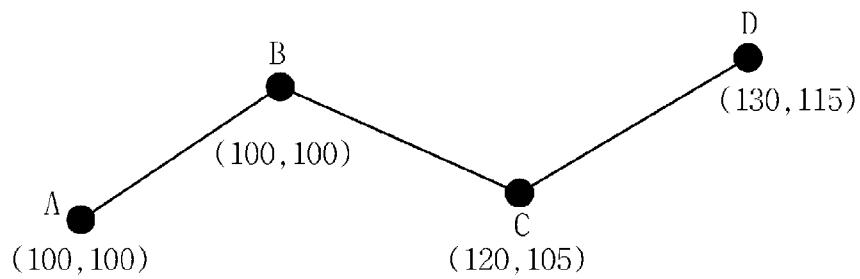
FIG. 2 illustrates an example of particular points A, B, C and D and actual coordinates of each of the particular points A, B, C and D for explaining an embodiment of the present invention.

FIG. 2 illustrates particular points A, B, C and D and coordinate data of each of the particular points A, B, C and D. In this case, the order of alignment may be A, B, C, and D, and the reference selection unit 110 may select a position coordinate of a point A among them as reference data.

The data changing unit 120 performs a function of changing spatial data of the next order, i.e., position coordinates, in consideration of a relative position between the reference data selected by the reference selection unit 110 and spatial data of the next order.

For example, the data changing unit 120 calculates relative position coordinates of a point B based on the point A using position coordinates of the point A and position coordinates of the point B and changes the calculated relative position coordinates into the position coordinates of the point B.

The fixed-size storing unit 130 performs a function of storing the spatial data changed by the data changing unit 120 in a unit storage space having a predetermined size.

For example, the fixed-size storing unit 130 may store each position coordinates, i.e., X and Y coordinates, in a unit storage space of 4byte. In this case, a total 8byte storage space is required to represent position coordinates of one particular point.

The above-described procedure may also be repeatedly performed.

That is, the reference selection unit 110 reselects the reference data sequentially, and the data changing unit 120 and the fixed-size storing unit 130 are repeatedly performed whenever the reference data is reselected.

For example, the reference selection unit 110 may reselect the position coordinates of the point B as the reference data. In this case, the data changing unit 120 calculates relative position coordinates of a point C based on the point B using position coordinates of the point B and the point C and changes the calculated relative position coordinates as the position coordinates of the point C.

Simultaneously, when the reference selection unit 110 selects the position coordinates of the point C as the reference data, the data changing unit 120 may calculate relative position coordinates of a point D based on the point C using position coordinates of the point C and the point D and may change the calculated relative position coordinates into the position coordinates of the point D.

Figure 3:
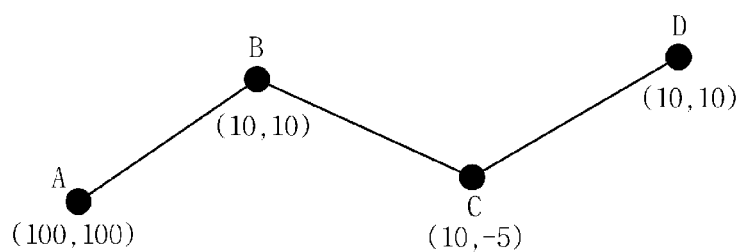
FIG. 3 illustrates an example in which each particular point of FIG. 2 is changed according to relative coordinates.

An example in which the position coordinates of the points B, C and D have been changed through this procedure, is shown in FIG. 3. Here, first point-A data in which no data is changed, is referred to as first reference data.

When a plurality of position coordinates are applied, it is clear that the size of relative position coordinates is smaller than the size of absolute position coordinates. Thus, it is clear than the entire size of the position coordinates is reduced through this procedure.

Figure 4:
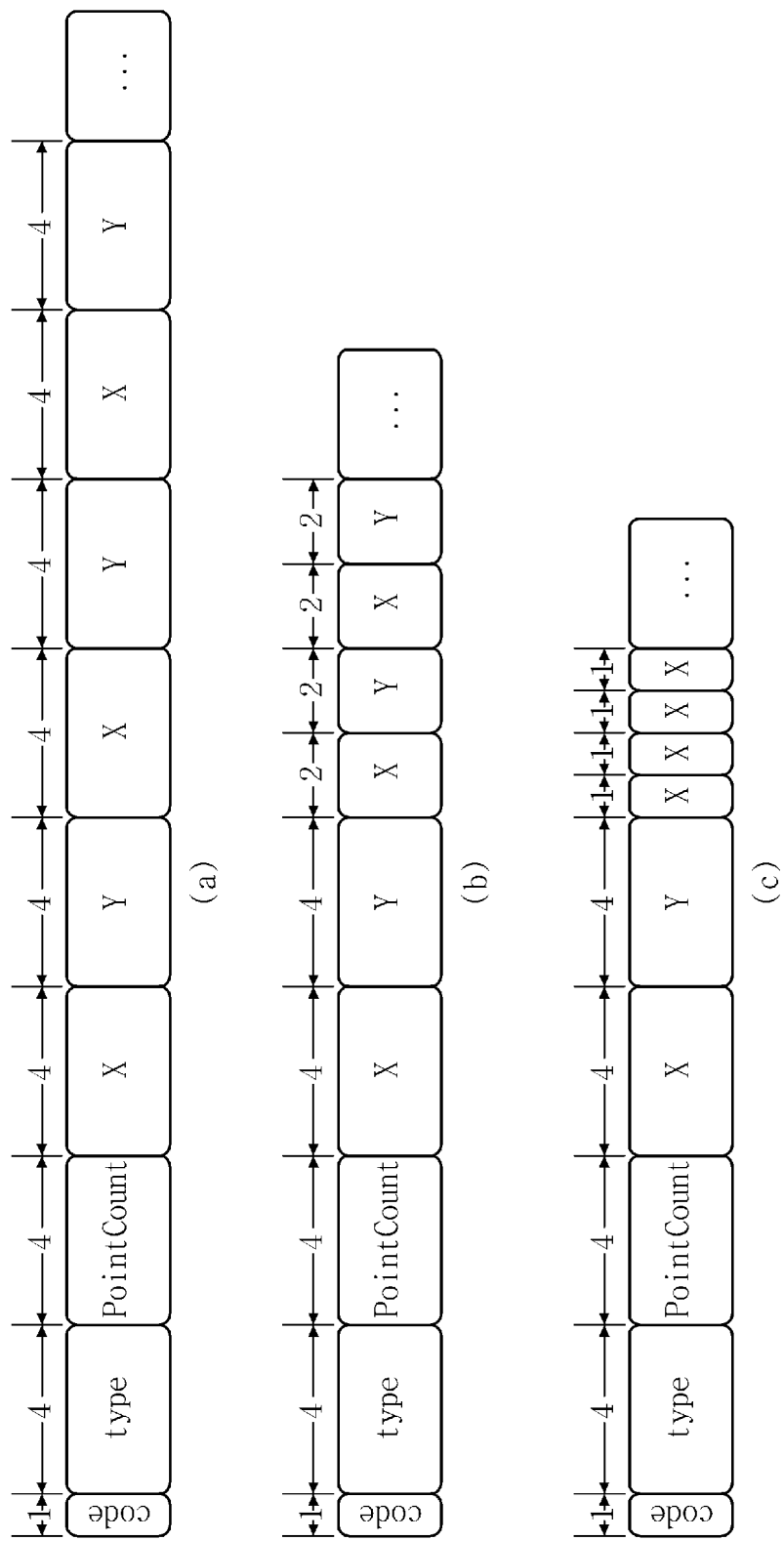
FIG. 4 illustrates examples of a structure in which linestring type data represented by relative coordinates is stored.

FIG. 4 illustrates examples of a structure in which linestring type data represented by relative coordinates is stored.

Referring to (a) of FIG. 4, information regarding the size of a storage space in which data of other points except for first reference data are stored, is stored in a field 'code' of a first byte. In (a) of FIG. 4, information of 4byte is stored, and in (b) of FIG. 4, information of 2byte is stored, and in (c) of FIG. 4, information of 1byte is stored.

That is, the size of a unit storage space in which changed data is stored, is 4 byte in (a) of FIG. 4, 2 byte in (b) of FIG. 4 and 1byte in (c) of FIG. 4.

In FIG. 4, the first reference data has the size of 4byte.

In FIG. 4, the number of particular points is stored in a field 'PointCount'.

In the above-described example, reference data is selected in the order of A, B and C. However, reference data may be selected in the order of C, B and A.

The determination unit 140 performs a function of determining the size of spatial data stored in the unit storage space having a predetermined size, i.e., actual data of coordinate data.

For example, even if the size of the unit storage space in which coordinate data is stored, is 4byte, an integer value of the actually-stored coordinate data may be equal to or less than 2byte. The determination unit 140 performs a function of determining the size of the actual data of the coordinate data stored in the unit storage space in this way.

The flag generation unit 150 performs a function of generating flag information considering the size of the actual data of the coordinate data determined by the determination unit 140.

Here, the flag generation unit 150 may generate flag information using 2bit, for example. For example, when the size of the coordinate data is equal to or less than 6bit, flag information of a binary number '00' may be generated, and when the size of the coordinate data is greater than 6bit and equal to or less than 14bit, flag information of a binary number '01' may be generated, and when the size of the coordinate data is greater than 14bit and equal to or less than 30bit, flag information of a binary number '11' may be generated.

The size selection unit 160 performs a function of selecting the size of a compression storage space in which coordinate data is compressed and stored in consideration of the size of the actual data of the coordinate data.

For example, when the size of the coordinate data is equal to or less than 6bit, the size selection unit 160 may select the size of the compression storage space of 1byte, and when the size of the coordinate data is greater than 6bit and equal to or less than 14bit, the size selection unit 160 may select the size of the compression storage space of 2byte, and when the size of the coordinate data is greater than 14bit and equal to or less than 30bit, the size selection unit 160 may select the size of the compression storage space of 4byte.

The compression storing unit 170 performs a function of storing the flag information generated by the flag generation unit 150 in a predetermined region of the compression storage space having the size selected by the size selection unit 160 and of storing the actual data of the coordinate data in the other regions, i.e., the other regions after the flag information is stored) of the compression storage space.

For example, if it is assumed that coordinate data 28,7850 and 510000000 are stored in the storage space of 4byte, since first data '28' is a value that is equal to or less than 6bit, the coordinate data 28 is stored in a compression storage space of 1byte together with flag information '00', and since second data '7850' is a value that is greater than 6bit and less than 14bit, the coordinate data 7850 is stored in a compression storage space of 2byte together with flag information '01', and since third data '510000000' is a value that is greater than 14bit and less than 30bit, the coordinate data 510000000 is stored in a compression storage space of 4byte together with flag information '11'.

That is, the entire size of the compression storage space may correspond to a size obtained by adding the size of a flag storage region and the size of a data storage region. The size of the flag storage region may correspond to 2bit, and the size of the data storage region may correspond to 6bit, 14bit and 30bit according to data in the above-described example. Thus, the entire size of the compression storage space may be 1byte, 2byte or 4byte.

Figure 5:
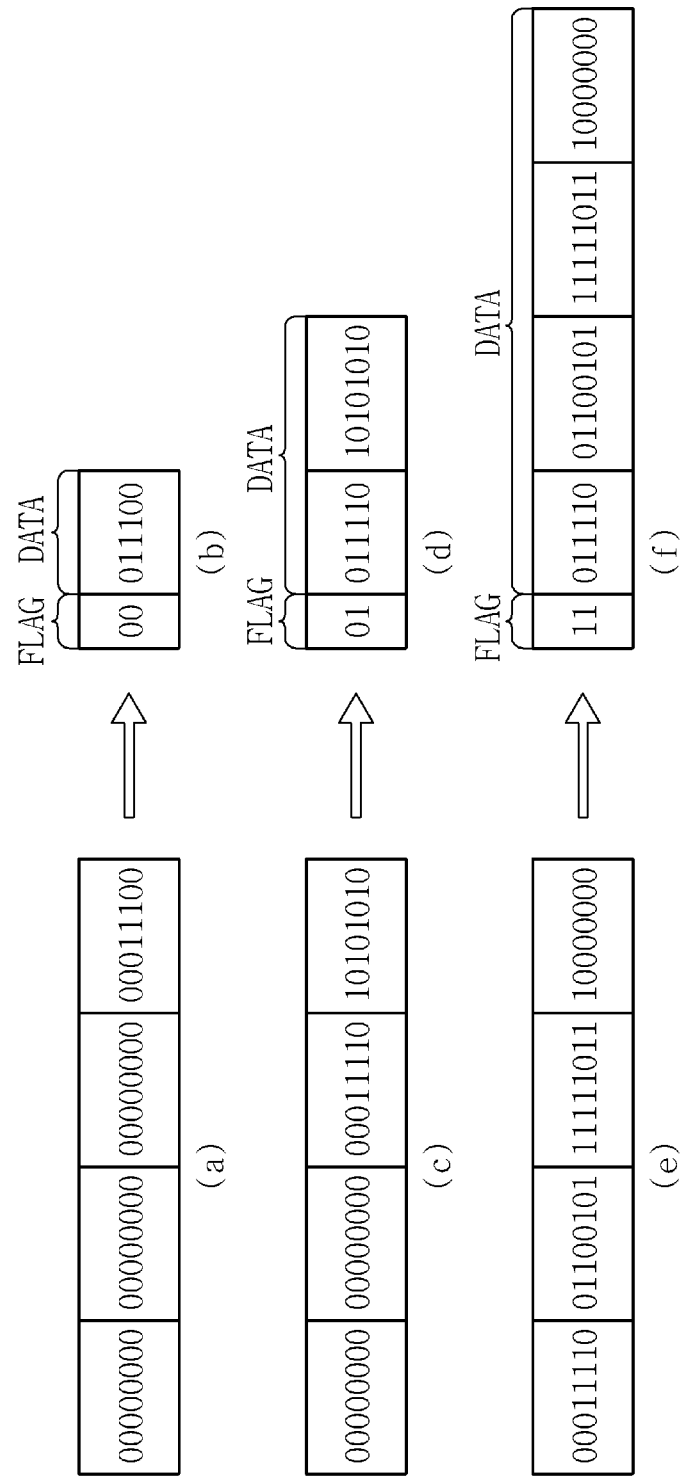
FIG. 5 illustrates an example in which data is changed through a compression procedure using flag.

FIG. 5 shows the result obtained by performing the above-described conversion procedure.

That is, (a), (c) and (e) of FIG. 5 show a state in which coordinate data is stored in the storage space of 4byte. A state in which coordinate data is stored in a compression storage space having different sizes according to the sizes of the stored coordinate data, is shown in (b), (d) and (f) of FIG. 5.

As illustrated in (b), (d) and (f) of FIG. 5, the flag information may be stored in a first region having a predetermined size (the size of 2bit in FIG. 5) of the compression storage space.

Hereinafter, an apparatus for restoring compressed coordinate data through the above-described procedure will be described.

Figure 6:
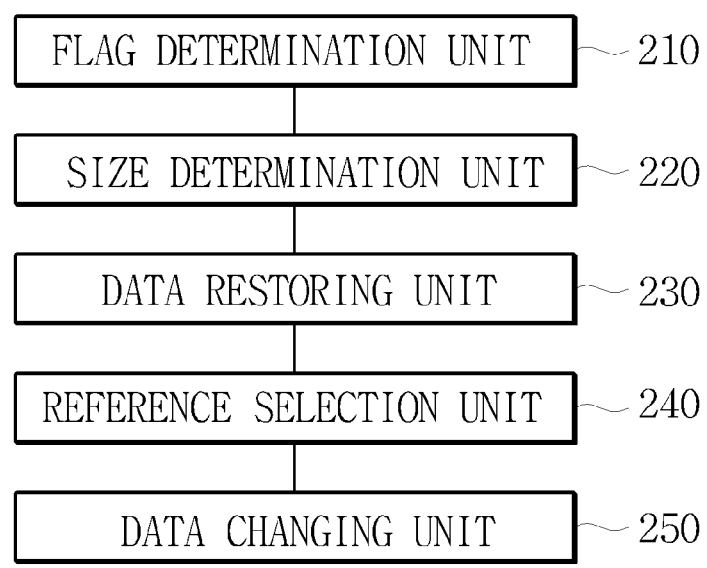
FIG. 6 is a functional block diagram of an apparatus for compressing spatial data according to an embodiment of the present invention.

As illustrated in FIG. 6, an apparatus for restoring compressed spatial data, i.e., coordinate data, may include a flag determination unit 210, a size determination unit 220, a data restoring unit 230, a reference selection unit 240 and a data changing unit 250.

The flag determination unit 210 performs a function of determining a position in which flag information is stored in a compression storage space.

For example, the flag determination unit 210 performs a function of determining first 2bit as the position in which the flag information is stored in the compression storage space illustrated in (b), (d) or (f) of FIG. 5. The flag information may not need to be stored in an upper bit of the compression storage space but may be stored in a lower bit of the compression storage space. Preferably, the flag information may be stored in an upper bit having a predetermined size of the compression storage space.

The size determination unit 220 performs a function of determining the size of the data storage region of the compression storage space allocated to the spatial data by reading the flag information in the position determined by the flag determination unit 210.

For example, since in (b) of FIG. 5, the flag information is '00', the size determination unit 220 may determine the size of the data storage region as 6bit, and since in (d) of FIG. 5, the flag information is '01', the size determination unit 220 may determine the size of the data storage region as 14bit, and since, in (f) of FIG. 5, the flag information is '11' the size determination unit 220 may determine the size of the data storage region as 30bit.

The data restoring unit 230 performs a function of restoring the spatial data, i.e., the coordinate data, by reading data having the size of the data storage region determined by the size determination unit 220. In this case, restoring the coordinate data may mean reading data having the size of the data storage region and storing the data in a unit storage space having a predetermined size.

Here, if it is assumed that the size of the unit storage space is 4byte, restoring the coordinate data means converting data from (b) of FIG. 5 to (a) of FIG. 5, converting data from (d) of FIG. 5 to (c) of FIG. 5 and converting data from (f) of FIG. 5 to (e) of FIG. 5.

Figure 7:
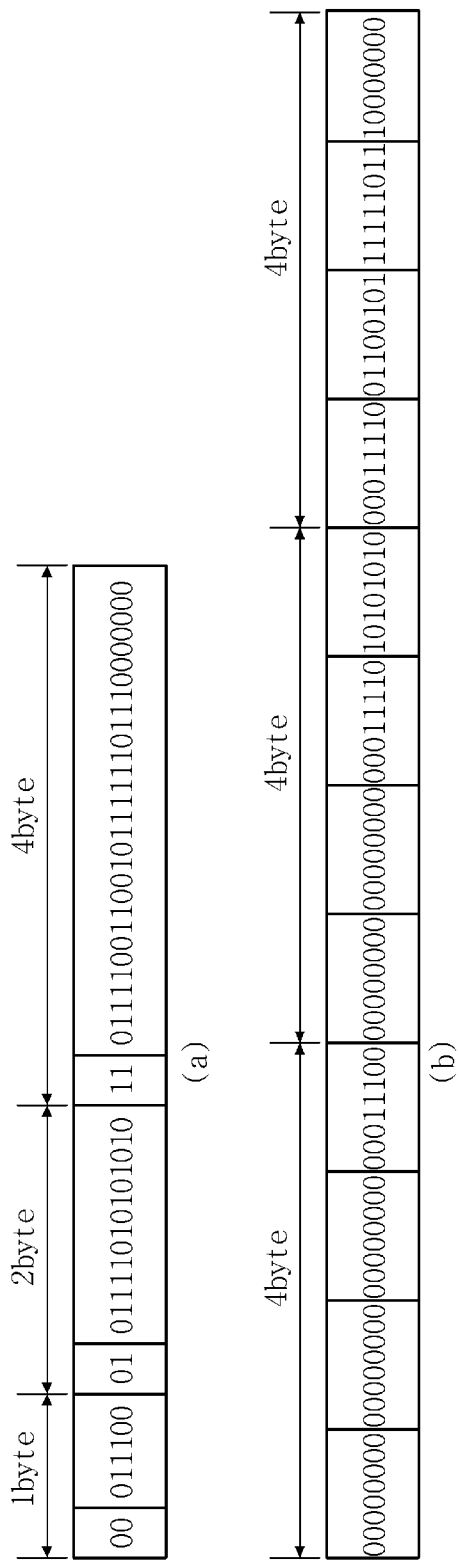
FIG. 7 illustrates a procedure in which data is restored.

If it is assumed that (b) of FIG. 5, (d) of FIG. 5 and (f) of FIG. 5 are a series of aligned data, the series of aligned data may be shown in (a) of FIG. 7. Each coordinate data may be sequentially stored in a unit storage space comprised of 4byte, as illustrated in (b) of FIG. 7, through the above-described conversion procedure.

The reference selection unit 240 performs a function of selecting reference data from a plurality of aligned spatial data, and the data changing unit 250 performs a function of changing the spatial data of the next order based on a value obtained by adding the reference data selected by the reference selection unit 240 and the spatial data of the next order.

For example, when a plurality of coordinate data are present, as illustrated in FIG. 3, the reference selection unit 240 selects first data of a point A as the reference data, and the data changing unit 250 sets a value obtained by adding coordinate data of the point A and coordinate data of the point B as new coordinate data of the point B.

In this case, the changed coordinate data of the point B may be selected as another reference data, and the selected coordinate data of the point B may be basic data for calculating new coordinate data of the point C.

Figure 8:
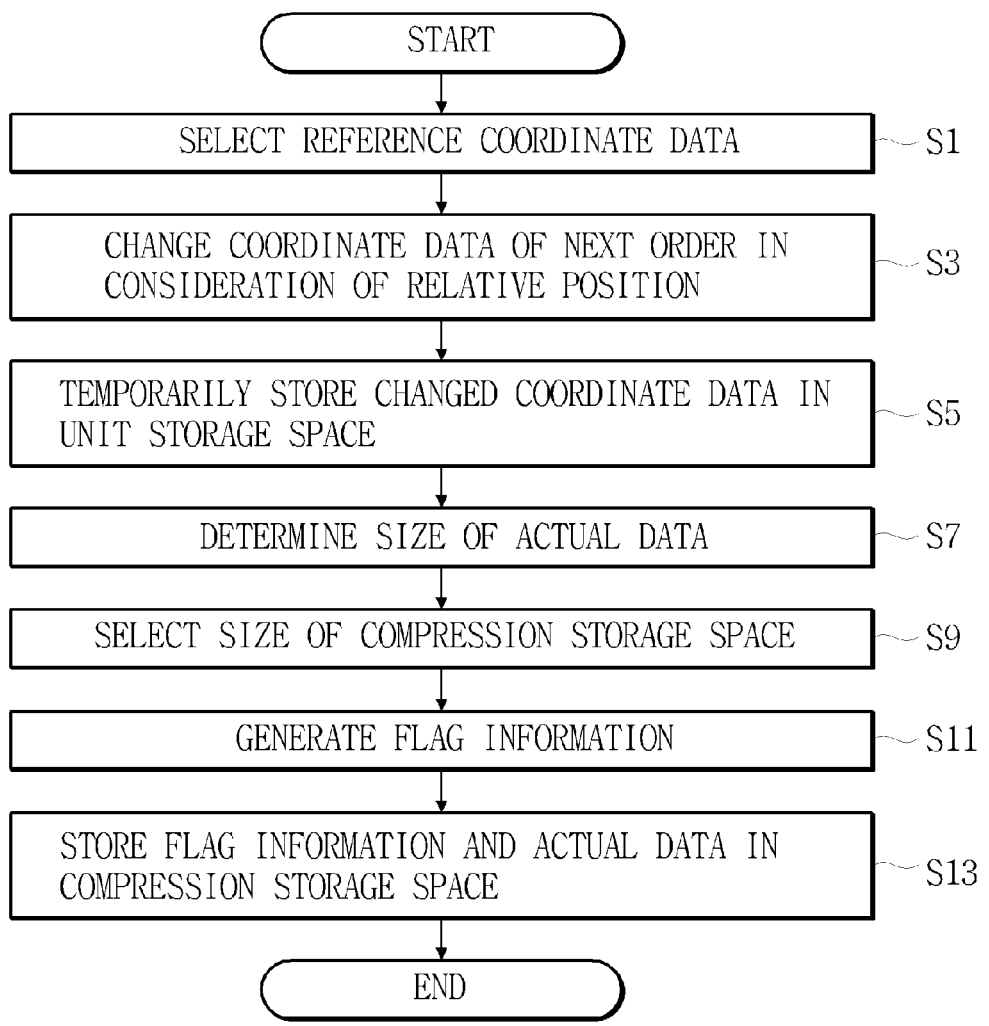
FIG. 8 is a control flowchart of the apparatus for compressing spatial data illustrated in FIG. 1.

Hereinafter, an operation of controlling the apparatus for compressing the spatial data illustrated in FIG. 1 will be described with reference to FIG. 8. In describing the present embodiment, it is assumed that, when the coordinate data aligned in the order of (a) of FIG. 9 is referred to, X-coordinates and Y-coordinates of (a) of FIG. 9 are stored in a 4byte storage space. Thus, 32byte is required to store all coordinates of the points A, B, C and D.

First, the apparatus for compressing the spatial data selects one from the plurality of coordinate data aligned in (a) of FIG. 9 is selected as reference data (Operation S1), and first data of the point A is selected as the reference data.

Next, the apparatus for compressing the spatial data changes coordinate data of the point B in consideration of a relative position between the coordinate data of the point A and the coordinate data of the point B of the next order (Operation S3) and temporarily stores the changed coordinate data in a unit storage space having a predetermined size (Operation S5). In the present embodiment, it is assumed that the unit storage space is 4byte.

This procedure may be repeatedly performed. For example, the apparatus for compressing the spatial data may select a point B before change as the reference data, may change the coordinate data of the point C of the next order, may select a point C before change as the reference data and then may change the coordinate data of the point D of the next order.

The result of changing each coordinate data is shown in (b) of FIG. 9.

Comparing (a) of FIG. 9 with (b) of FIG. 9, the sizes of numbers used as coordinates of the points B, C and D are remarkably reduced.

In this state, the apparatus for compressing the spatial data determines the size of actual data of the coordinate data stored in (b) of FIG. 9 (Operation S7) and selects the size of the compression storage space in which the coordinate data is to be compressed and stored, in consideration of the determined size of the actual data of the coordinate data (Operation S9).

For example, in order to store the X-coordinates and the Y-coordinates of the point A, the apparatus for compressing the spatial data selects the size of the compression storage space of 4byte, selects 1byte in the point B and selects 2byte in the point D.

The apparatus for compressing the spatial data generates flag information considering the size of the actual data of the coordinate data of each of the points A, B, C and D (Operation S11). For example, in case of the point A in which the compression storage space of 4byte is required, flag information of a binary number '11' is generated, and in case of the point B in which the compression storage space of 1byte is required, flag information of a binary number '00' is generated, and in case of the points C and D in which the compression storage space of 2byte is required, flag information of a binary number '01' is generated.

Subsequently, the apparatus for compressing the spatial data stores the generated flag information in a predetermined region of the compression storage space having a previously-selected size and stores actual data of the spatial data in the other regions of the compression storage space (Operation S13).

For example, in case of the point A, the apparatus for compressing the spatial data stores actual data '18000000' in the compression storage space of 4byte together with flag information of '11', and in case of the point B, the apparatus for compressing the spatial data stores actual data '20' in the compression storage space of 1byte together with the flag information of '00', and in case of the point C, the apparatus for compressing the spatial data stores actual data '−8000' in the compression storage space of 2byte together with flag information '01', and in case of the point D, the apparatus for compressing the spatial data stores actual data '100' in the compression storage space of 2byte together with flag information of '01'.

(a) of FIG. 10 illustrates a binary structure regarding original coordinate data of each of particular points, and (b) of FIG. 10 illustrates a binary structure regarding final coordinate data converted through the above-described procedure.

Comparing (a) of FIG. 10 with (b) of FIG. 10, total 32byte is required before compression so as to store coordinate data of each of the particular points. However, only 18byte is required after compression. In FIG. 10, actual data of the particular points are indicated by decimal numbers for conveniences, and only flag information are indicated by binary numbers.

The apparatus for compressing the spatial data may perform Operations S1 through S5 on all coordinate data and then may perform Operations S7 through S13 on each of resultant data obtained by performing Operations S1 through S5 or may perform Operations S1 through S13 on each coordinate data once.

Figure 11:
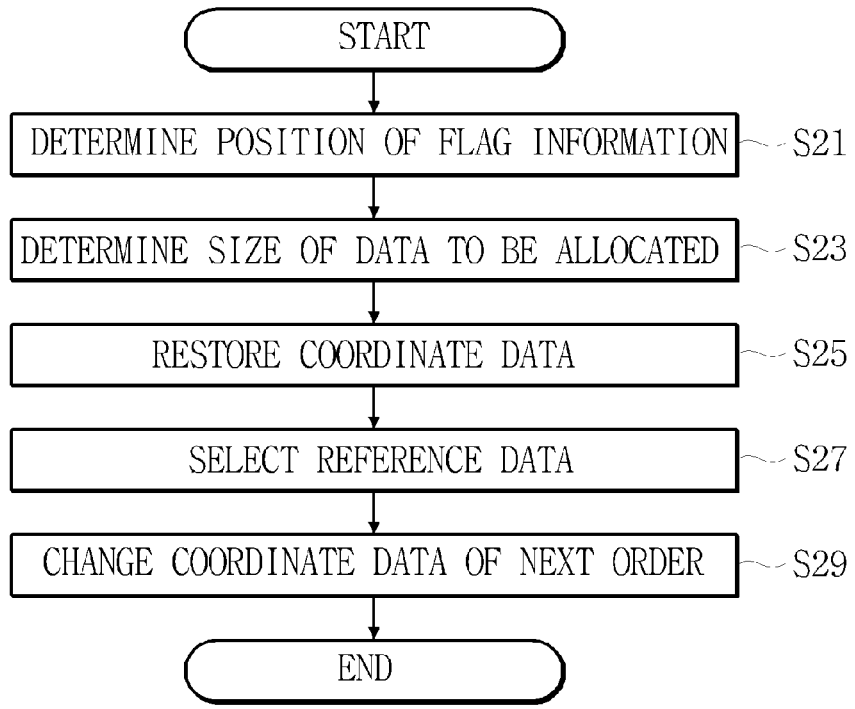
FIG. 11 is a control flowchart of an apparatus for restoring compressed spatial data according to an embodiment of the present invention.

Hereinafter, an operation of controlling an apparatus for restoring the compressed spatial data will be described with reference to FIG. 11.

The operation of controlling the apparatus for restoring the compressed spatial data is performed in an opposite order to that of the operation of controlling the apparatus for compressing the spatial data.

First, the apparatus for restoring the compressed spatial data determines a position in which flag information is stored in each compression storage space (Operation S21).

For example, the apparatus for restoring the compressed spatial data may determine first 2bit of the compression storage space as the position in which flag information is stored.

Subsequently, the apparatus for restoring the compressed spatial data determines the size of a data storage region of the compression storage space allocated to the coordinate data by reading the flag information (Operation S23). For example, the apparatus for restoring the compressed spatial data of FIG. 10 may read first 2bit '11' and may determine the size of the data storage region that means a space in which the coordinate data is stored, as 30bit.

After determining the size of the data storage region, the apparatus for restoring the compressed spatial data restores the coordinate data by reading data having the determined size of the data storage region (Operation S25).

For example, the apparatus for restoring the compressed spatial data of FIG. 10 reads data stored in a 30bit region placed after the size of the flag storage region, i.e., 2bit, and temporarily stores the data in a predetermined unit storage space (a storage space of 4byte in the present embodiment).

This procedure may be repeatedly performed on all coordinate data, and a table shown in (b) of FIG. 9 may be generated as a result of performing this procedure.

Subsequently, the apparatus for restoring the compressed spatial data performs a function of selecting reference data from a plurality of aligned spatial data (Operation S27) and of changing coordinate data of the next order based on a value obtained by adding the selected reference data and coordinate data of the next order (Operation S29).

For example, the apparatus for restoring the compressed spatial data may select (18000000, 18000000) that is data of the point A of (b) of FIG. 9 as reference data and then may change a value obtained by adding the selected reference data and coordinate data of the point B of the next order as new coordinate data of the point B. Thus, the coordinate data of the point B may be (18000020, 18000030), as illustrated in (a) of FIG. 9.

Next, the apparatus for restoring the compressed spatial data may select the restored coordinate data of the point B as the reference data and then may change a value obtained by adding the selected reference data and coordinate data of the point C of the next order as new coordinate data of the point C. Thus, the new coordinate data of the point C may be (17992020, 17992030), as illustrated in (a) of FIG. 9.

Last, the apparatus for restoring the compressed spatial data may select the restored coordinate data of the point C as the reference data and then may change a value obtained by adding the selected reference data and coordinate data of the point D of the next order as new coordinate data of the point D. Thus, the new coordinate data of the point C may be (17992120, 17992100), as illustrated in (a) of FIG. 9.

Thus, the finally-converted coordinate data may be expressed in a binary structure, as illustrated in (a) of FIG. 10.

In this way, a storage space is reduced using the relationship between the points that constitute the spatial data, and the storage space is abbreviated by analyzing the actual size of the coordinate data so that the entire size of the coordinate data can be reduced.

Figure 12:
FIG. 12 is an image of a map including a plurality of elements.

FIG. 12 is an image of a map including a plurality of elements, and FIGS. 13A through 13C show the result of compressing coordinate data of each of the plurality of elements of FIG. 12.

Referring to FIG. 13A, original data of 159 bytes may be converted into abbreviated data of 102 bytes, and referring to FIG. 13B, original data of 269 bytes may be converted into abbreviated data of 166 bytes, and referring to FIG. 13C, original data of 179 bytes may be converted into abbreviated data of 118 bytes.

In this way, the effect of reducing the size of the spatial data by about 34 to 40% can be achieved. This causes resources to be effectively utilized in a mobile terminal environment so that good GIS services can be provided.

Also, since the entire amount of the spatial data is reduced due to compression, a time required to restore the compressed spatial data and to load the restored spatial data into an application service system is provided at the same level as an existing time so that a problem of lowering of performance caused by compression does not occur.

Meanwhile, the procedure for performing each of the above-described embodiments may be performed by a program stored in a predetermined recording medium, for example, a computer-readable recording medium.

INDUSTRIAL APPLICABILITY

As described above, according to one or more of the above-described embodiments of the present invention, the entire size of spatial data required to provide geographic information system (GIS) services can be effectively reduced. This causes insufficient resources in a mobile environment to be effectively utilized so that good GIS services can be provided.

Also, since the entire amount of the spatial data is reduced due to compression, a time required to load compressed data into an application service system is reduced so that the time is offset with a time required to restore the compressed data and a problem of the entire time delay using the spatial data does not occur.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of compressing spatial data comprising:
   (a) determining the size of actual data of the spatial data stored in a unit storage space having a predetermined size;
   (b) selecting the size of a compression storage space in which the spatial data is to be compressed and to be stored, in consideration of the determined size of the actual data of the spatial data;
   (c) generating flag information considering the size of the actual data of the spatial data; and
   (d) storing the generated flag information in a predetermined region of the compression storage space having the selected size and storing the actual data of the spatial data in the other regions of the compression storage space.

2. The method of claim 1, wherein the flag information is stored in a first region having a predetermined size of the compression storage space.

3. The method of claim 1, further comprising, before (a):
   (a1) selecting one spatial data from a plurality of aligned spatial data as reference data;
   (a2) changing spatial data of a next order in consideration of a relative position between the reference data and spatial data of the next order; and
   (a3) storing the changed spatial data in a unit storage space having a predetermined size.

4. The method of claim 3, further comprising, after (a3), sequentially reselecting reference data from the plurality of aligned spatial data,
   wherein (a2) to (a3) are repeatedly performed whenever the reference data is reselected.

5. The method of claim 1, wherein the flag information is placed in a first region having a predetermined size of the compression storage space.

6. A method of restoring compressed spatial data comprising:
   (a) determining a position of a compression storage space in which flag information is stored;
   (b) determining the size of a data storage region of the compression storage space allocated to the spatial data by reading the flag information in the position determined in (a); and
   (c) restoring the spatial data by reading data having the size of the data storage region determined in (b) and by storing the read data in a unit storage space having a predetermined size.

7. The method of claim 6, further comprising:
   selecting reference data from a plurality of spatial data respectively aligned in a unit storage space having a predetermined size; and
   changing the spatial data of a next order based on a value obtained by adding the selected reference data and the spatial data of the next order.

8. An apparatus for compressing spatial data comprising:
   a determination unit determining the size of actual data of the spatial data stored in a unit storage space having a predetermined size;
   a flag generation unit generating flag information considering the size of the actual data of the spatial data determined by the determination unit;
   a size selection unit selecting the size of a compression storage space in which the spatial data is to be compressed and to be stored, in consideration of the determined size of the actual data of the spatial data; and
   a compression storing unit storing the generated flag information in a predetermined region of the compression storage space having the selected size and storing the actual data of the spatial data in the other regions of the compression storage space.

9. The apparatus of claim 8, wherein the flag information is stored in a first region having a predetermined size of the compression storage space.

10. The apparatus of claim 8, further comprising:
    a reference selection unit selecting one spatial data from a plurality of aligned spatial data as reference data;
    a data changing unit changing spatial data of a next order in consideration of a relative position between the reference data selected by the reference selection unit and spatial data of the next order; and a fixed-size storing unit storing the spatial data changed by the data changing unit in a unit storage space having a predetermined size.

11. The apparatus of claim 10, wherein the reference selection unit further comprises performing sequentially reselecting reference data from the plurality of aligned spatial data,
wherein the data changing unit and the fixed-size storing unit are repeatedly performed whenever the reference data is reselected.

12. An apparatus for restoring compressed spatial data comprising:
a flag determination unit determining a position of a compression storage space in which flag information is stored;
a size determination unit determining the size of a data storage region of the compression storage space allocated to the spatial data by reading the flag information in the position determined by the flag determination unit; and
a data restoring unit restoring the spatial data by reading data having the size of the data storage region determined by the size determination unit and by storing the read data in a unit storage space having a predetermined size.

13. The apparatus of claim 12, wherein the flag information is placed in a first region having a predetermined size of the compression storage space.

14. The apparatus of claim 12, further comprising:
a reference selection unit selecting reference data from a plurality of spatial data respectively aligned in a unit storage space having a predetermined size; and
a data changing unit changing the spatial data of a next order based on a value obtained by adding the selected reference data and the spatial data of the next order.

\* \* \* \* \*